United States Patent
Zan et al.

(10) Patent No.: US 11,870,439 B2
(45) Date of Patent: Jan. 9, 2024

(54) PULSE GENERATOR

(71) Applicant: The Regents of the University of Michigan, Ann Arbor, MI (US)

(72) Inventors: Xin Zan, Ann Arbor, MI (US); Al-Thaddeus Avestruz, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 18/077,759

(22) Filed: Dec. 8, 2022

(65) Prior Publication Data

US 2023/0179182 A1   Jun. 8, 2023

Related U.S. Application Data

(60) Provisional application No. 63/287,366, filed on Dec. 8, 2021.

(51) Int. Cl.
*H03K 3/00* (2006.01)
*H03K 3/01* (2006.01)
*H03K 5/01* (2006.01)

(52) U.S. Cl.
CPC ............. *H03K 3/01* (2013.01); *H03K 5/01* (2013.01)

(58) Field of Classification Search
CPC .................................. H03K 3/01; H03K 5/01
USPC ......................................................... 327/304
See application file for complete search history.

(56) References Cited

U.S. PATENT DOCUMENTS

| 4,841,220 A | * | 6/1989 | Tabisz | H02M 3/33571 363/16 |
|---|---|---|---|---|
| 4,857,822 A | * | 8/1989 | Tabisz | H02M 3/33592 363/16 |
| 4,868,730 A | * | 9/1989 | Ward | H02M 3/33569 323/224 |
| 5,097,196 A | * | 3/1992 | Schoneman | H02M 3/1582 323/224 |
| 5,341,278 A | * | 8/1994 | Brooks | H02M 3/158 363/16 |
| 7,518,574 B2 | * | 4/2009 | Park | G09G 3/2965 345/60 |

(Continued)

OTHER PUBLICATIONS

A. de Angelis, J. F. Kolb, L. Zeni, and K. H. Schoenbach, Kilovolt Blumlein pulse generator with variable pulse duration and polarity; Review of Scientific Instruments, vol. 79, No. 4, p. 044301, 2008.

(Continued)

*Primary Examiner* — Ryan Jager
(74) *Attorney, Agent, or Firm* — LEMPIA SUMMERFIELD KATZ LLC (57) ABSTRACT

A pulse shaping device includes an inductor that is selectively output-coupled to a first port of a capacitor. The inductor is charged to a selected current throughput and then coupled to the first port to generate a first characteristic within the current flowing at a second port of the capacitor. The capacitor is charged until reaching a clamping voltage at the first port. A voltage clamp of the shaping device clamps the first port of the capacitor at the clamping voltage to generate a second characteristic within the current flowing at a second port of the capacitor.

20 Claims, 4 Drawing Sheets

(56) References Cited

U.S. PATENT DOCUMENTS

2023/0179182 A1* 6/2023 Zan .................... H03K 3/01
327/304

OTHER PUBLICATIONS

A. Elserougi et al.; A boost converter-based ringing circuit with high-voltage gain for unipolar pulse generation; IEEE Trans on Dielectrics and Electrical Insulation; vol. 23, 4, 2016, pp. 2088-2094.

A. Elserougi, A. Massoud, and S. Ahmed; Multimodule boost-converter-based pulse generators: Design and operation; IEEE Transactions on Plasma Science, vol. 48, No. 1, 2020; 9 pp.

A. Ray et al.; Coupled inductor-based zero current switching hybrid DC circuit breaker topologies, IEEE Transactions on Industry Applications, vol. 55, No. 5, pp. 5360-5370, 2019.

A. S. Yudin et al.; Two—section pulse current generator for concrete and rocks destruction by splitting off; IEEE Transactions on Plasma Science, vol. 45, No. 11, pp. 3042-3045, 2017.

B. Pauli et al., Development of a high current HVDC circuit breaker with fast fault clearing capability; IEEE Transactions on Power Delivery, vol. 3, No. 4, pp. 2072-2080, 1988.

G.-H. Rim, E. Pavlov, H.-S. Lee, J. Kim, and Y.-W. Choi; Pulse forming lines for square pulse generators; IEEE Transactions on Plasma Science, vol. 31, No. 2, pp. 196-200, 2003.

H. Blinchikoff and R. Gardenghi; A modular PFN with pulsewidth agility; IEEE Transactions on Electron Devices, vol. 26, No. 10, pp. 1537-1540, 1979.

H. Li, H.-J. Ryoo, J.-S. Kim, G.-H. Rim, Y.-B. Kim, and J. Deng; Development of rectangle-pulse Marx generator based on PFN; IEEE Transactions on Plasma Science, vol. 37, No. 1, pp. 190-194, 2009.

H. Xiao, L. Li, H. Ding, T. Peng, and Y. Pan; Study on a highly stabilized pulsed power supply for high magnetic fields; IEEE Transactions on Power Electronics, vol. 26, No. 12, pp. 3817-3822, 2011.

McNab; Developments in pulsed power technology; IEEE Transactions on Magnetics, vol. 37, No. 1, pp. 375-378, 2001.

J. Clementson et al.; Design of A, B, and C pulse forming networks using the VINPFN application; IEEE Transactions on Power Electronics, vol. 29, No. 11, pp. 5673-5679, 2014.

J. Su et al.; A long-pulse generator based on Tesla transformer and pulse-forming network; IEEE Transactions on Plasma Science, vol. 37, No. 10, pp. 1954-1958, 2009.

J. W. Baek, D. W. Yoo, G. Rim, and J.-S. Lai; Solid state Marx generator using series-connected IGBTs; IEEE Transactions on Plasma Science, vol. 33, No. 4, pp. 1198-1204, 2005.

K. A. Corzine; A new-coupled-inductor circuit breaker for DC applications; IEEE Transactions on Power Electronics, vol. 32, No. 2, pp. 1411-1418, 2017.

L. Qi et al.; A novel forced resonant mechanical DC circuit breaker by using auxiliary oscillation switch for zero—crossing; IEEE Transactions on Power Electronics, 2021; 5 pp.

Ling et al., A pulsed power supply based on an optimized SFPFN scheme producing large currents with a flat top on a heavily inductive load; IEEE Trans on Power Electronics, vol. 36, No. 10, 2021; 12 pp.

M. E. Sezgin and M. Göl; DC catenary line modeling of subway systems; 2018 IEEE Power Energy Society General Meeting (PESGM), 2018, pp. 1-5.

M. Xia, Y. Zhou, Y. Huang, H. Yang, and Y. Tai; Research on short-circuit characteristics of subway DC traction power supply system; IECON 2020 The 46th Annual Conference of the IEEE Industrial Electronics Society, 2020, pp. 3456-3460.

N. Carleto et al.; Design, construction and characterization of a line-type pulse modulator for driving high power magnetron; SBMO/IEEE MTT-S Inter Conf on Microwave and Optoelectronics; 2005, 4 pp.

R. Kheirollahi et al., A DC solid-state circuit breaker based on transient current commutation; IEEE Journal of Emerging and Selected Topics in Power Electronics, vol. 10, No. 4, 2022; pp. 4614-4625.

R. Kheirollahi et al., Capacitive couple-based transient current commutation in solid-state circuit breakers, IEEE Transactions on Power Electronics, vol. 37, No. 5, 2022; pp. 4973-4978.

R. Kheirollahi et al.; Ultra-fast solid-state circuit breaker with a modular active injection circuit; IEEE Journal of Emerging and Selected Topics in Industrial Electronics, 2021; 10 pp.

S. Mohsenzade et al.; A high-voltage pulse generator with continuously variable pulsewidth based on a modified PFN; IEEE Transactions on Plasma Science, vol. 45, No. 5, pp. 849-858, 2017.

S. Zhao et al.; A 4kV/120A SiC solid-state DC circuit breaker powered by a load-independent IPT system; IEEE Transactions on Industry Applications, 2021; 22 pp.

T. Eriksson, M. Backman, and S. Halen; A low loss mechanical HVDC breaker for HVDC grid applications; CIGRE 2014, 2014; 8 pp.

X. Xu et al.; Design of an isolated circuit breaker with robust interruption capability for DC microgrid protection; IEEE Transactions on Industrial Electronics, 2020; 10 pp.

X. Zhang et al.; A novel mixture solid-state switch based on IGCT with high capacity and IGBT with high turn-off ability for hybrid DC breakers; IEEE Trans on Ind Electr, vol. 67, No. 6, 2020; 10 pp.

Y. Wu, S. Peng, Y. Wu, M. Rong, and F. Yang; Technical assessment on self-charging mechanical HVDC circuit breaker, IEEE Transactions on Industrial Electronics, 2021, 9 pp.

Z. Li, H. Liu, S. Jiang, L. Guo, and J. Rao; A high-current all-solid-state pulse generator based on Marx structure; IEEE Transactions on Plasma Science, vol. 48, No. 10, pp. 3629-3636, 2020.

* cited by examiner

PULSE GENERATOR

PRIORITY

This application claims priority to U.S. Provisional Patent Application No. 63/287,366, filed Dec. 8, 2021, and titled PULSE GENERATOR, which is incorporated by reference herein in its entirety.

STATEMENT REGARDING FEDERALLY SPONSORED RESEARCH OR DEVELOPMENT

This invention was made with government support under DE-AR0001114 awarded by the Department of Energy. The government has certain rights in the invention.

BACKGROUND

Technical Field

The disclosure relates generally to electrical pulse generation.

Brief Description of Related Technology

Increasingly complex electronics have given rise to need for signal processing, switching, and pulse generation in various contexts. For example, devices including electronics may operate components at various power levels, using various signal forms and/or using various control inputs. Accordingly, there is increasing demand for systems that efficiently and accurately process and/or generate signals/pulses in variety of power and frequency environments. Improvements to signal/pulse processing and generation technologies will continue to drive industrial demand.

DETAILED DESCRIPTION

In various contexts, it may be desirable to generate electrical signals with specific properties. For example, when generating an electrical pulse, it may be desirable to control the rise, fall, duration of the pulse, relative flatness of the body of the pulse, brief response time, and/or other pulse characteristics.

In various implementations, it may be desirable to generate an electrical pulse, such as a current pulse and/or a voltage pulse, with a flattened top and fast rising and falling edges, and a short and/or controllable response time. In other words, it may be desirable to generate a "square" pulse shape in a short response time. Such square pulses may be useful in a variety of electrical applications, such as signal processing, signal generation, electrical control, power management, and/or other electrical applications. In the discussion below, electrical signals may be discussed for convenience and clarity as if assumed to have positive polarity. However, negative polarity signals may be readily used/generated using architectures and techniques discussed below. Thus, the architectures and techniques may be used interchangeably with positive and negative polarity signals, in some cases, with appropriate circuit polarity transformations.

Figure 1:
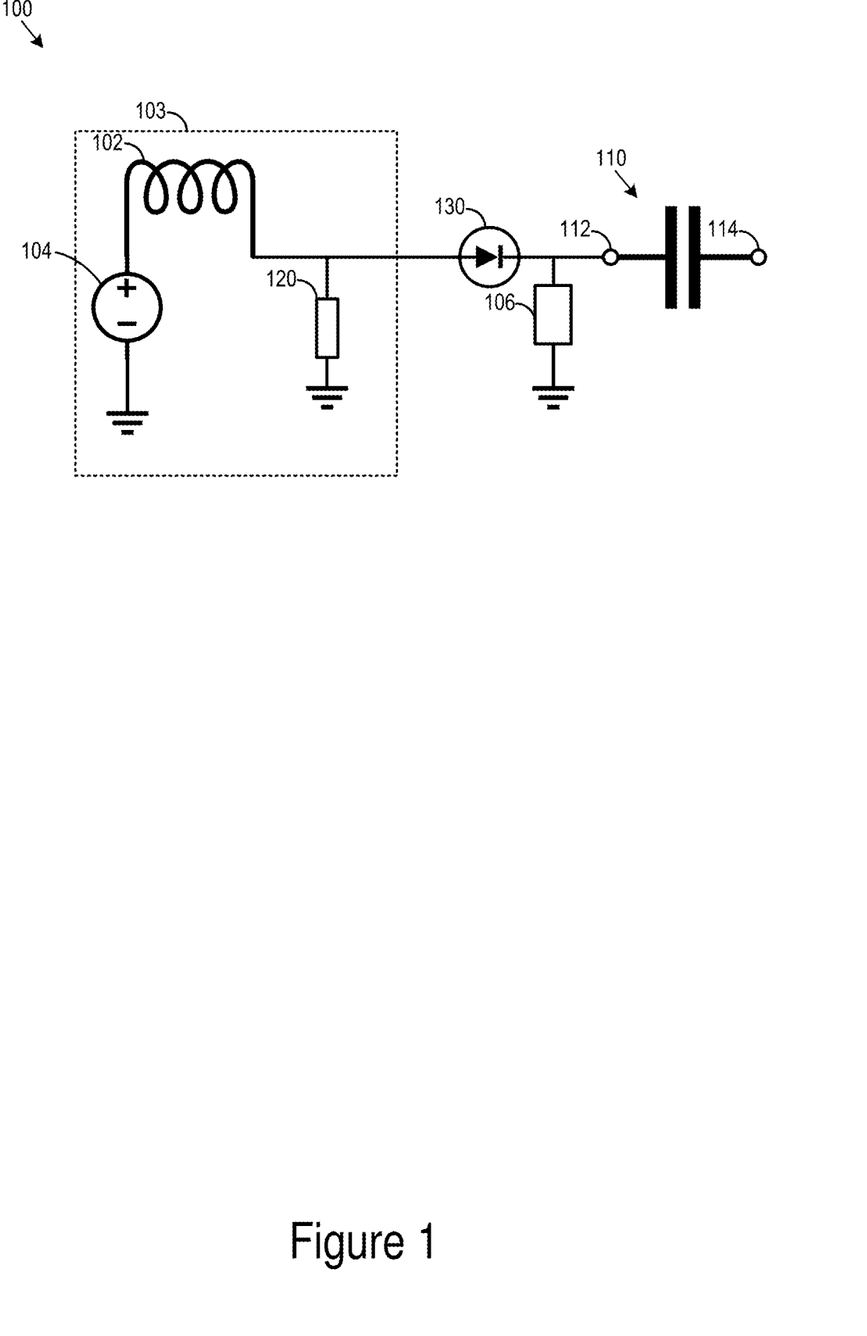
FIG. 1 shows an example shaping device.

Referring now to FIG. 1, an example shaping device 100 is shown. The shaping device may include an inductor 102 coupled to a power source 104, which is shown as a DC voltage source in FIG. 1. However, various other power sources may be used, e.g., power converters, AC sources paired with rectifiers, and/or other power sources. The inductor 102 may be selectively 120 output-coupled to a first port 112 of a capacitor 110. The inductor may be selectively 120 output-coupled to a charge circuit 103 while the inductor is charging. The first port 112 of the capacitor 110 is also coupled to a voltage clamp 106, which may activate at a clamping voltage.

The second port 114 of the capacitor 110 may be coupled to a load or other output. Charging/applied voltages on the first port 112 may shape the current flowing away from the second port 114. Thus, the selective coupling between the inductor 102 and the first port 112 may be used to shape the current output at the second port 114 together with the inductor 102 and the capacitor 110.

In various implementations, the selective coupler 120 may be implemented using a variety of switching devices. For example, the selective coupler 120 may include a mechanical switch, a solid-state switch, and/or another non-mechanical switch. For example, in some implementations, transistor circuitry and/or other logical switch circuitry may be used to perform the selective coupling 120.

In various implementations, the example shaping device 100 may a include reverse flow prevention device 130. The reverse flow prevention device may be coupled in series between the capacitor 110 and the inductor 102 to prevent reverse flows of current from the capacitor (and/or voltage clamp power sources) back to the inductor. For example, a diode or other reverse flow prevention device may be used.

Figure 2:
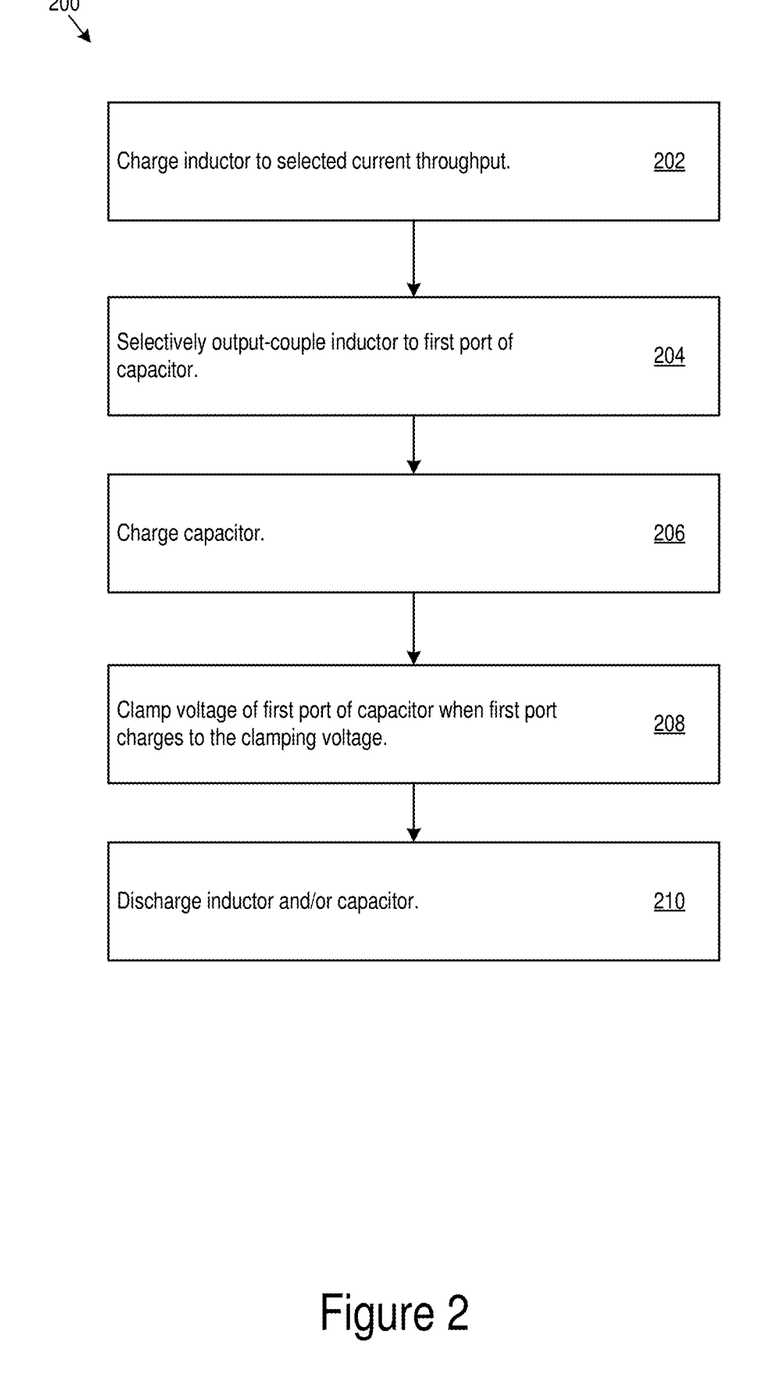
FIG. 2 shows example shaping logic.

Referring now to FIG. 2 while continuing to refer to FIG. 1, shaping logic 200 is shown. In various implementations, the shaping logic 200 may be implemented via control circuitry (e.g., for control and timing of the components of the shaping device 100). The inductor may be charged to a selected current throughput (202). In various implementations, the time taken to charge the inductor to the selected current throughput may define the response time of the shaping device 100. For example, the selected current throughput may be achieved by cycling increasing levels of current through the charge circuit 103 using the power source 104 until the selected current throughput through the inductor 102 is reached.

Once the selected current throughput is reached, the shaping logic may selectively output-couple the inductor 102 to the first port 112 of the capacitor 110 (204). Coupling the inductor 102 to the first port of the capacitor while current at the selected current throughput is running through the inductor 102 may result in the inductor 102 effectively pushing charge on to the corresponding side of the capacitor resulting in a corresponding response on the other side of the capacitor. Thus, the inductor may rapidly increase the magnitude of current through the second port 114 of the capacitor. This may shape a first characteristic of the current at the second port, for example a leading edge of a current pulse may be created.

As current is pushed to the first port 112 of the capacitor 110, the voltage at the first port 112 may increase. Thus, shaping logic 200 may cause the capacitor to be charged (206). In various implementations, the current from the inductor 102 may be constant (or nearly constant). Thus, the charging of the capacitor may be linear and the current at the second port 114 may be constant (e.g., relatively flat compared to rising and/or falling edges). Thus, a portion of a current pulse may be flat if that portion of the current pulse is relatively constant compared to rising and/or falling edges of the pulse. Because the charging time for the inductor 102 does not necessarily define the pulse duration, the pulse duration and response time may be decoupled in various implementations.

When the first port 112 of the capacitor reaches a selected clamping voltage, the shaping logic 200 may activate the voltage clamp 106 (or the voltage clamp 106 may be self-activated or passively operated) to hold the first port 112 at the selected clamping voltage (208). In some cases, the selective coupler may be held at the clamping voltage along with the first port. Holding the first port 112 at its current voltage works to shift the capacitor into a stationary charge state. Thus, charge will no longer be collecting in (or pushed out of) the capacitor 110. Thus, the current level at the second port 114 may fall (e.g., in magnitude) rapidly. Accordingly, clamping the voltage at the first port 112 may create a second characteristic in the current at the second port 114. For example, the second characteristic may include a falling edge of a current pulse.

In various implementations, the voltage clamp 106 may be activated for the purpose of pulse shaping, e.g., creation of a falling edge for a current pulse at the second port 114. Thus, the voltage clamp 106 may be coordinated with the charging driven by the inductor 102 and/or implemented as a portion of the nominal operation of the example shaping device 100. Accordingly, such operation of the voltage clamp 106 may be different from operation of a voltage clamp for the purpose of protecting electrical components from potential damage, e.g. due to over voltage. Additionally or alternatively, the coordination of the voltage clamp 106 with charging of the capacitor by the inductor and/or other operations may be a portion of the timings used to achieve target pulse durations and/or other shaping characteristics. Additionally or alternatively, the selected clamping voltage may be lower than a surge voltage for the inductor 102, the capacitor 110, the selective coupler 120, and/or other components of the example shaping device 100. For example, a surge voltage may be defined as a relation between a maximum current, $I_{max}$ (or other allowed peak operating current) and a characteristic impedance of the example shaping device 100, e.g., $$\sqrt{\frac{L}{C}}$$

where L is an inductance of the inductor 102 and C is the capacitance of the capacitor 110. In other words, in various implementations, the voltage clamp 106 may not necessarily be used for device protection, rather the voltage clamp 106 may be part of nominal operation where electrical levels that would implicate needs for device protection are not present. Applying such protective measures would not be recognized as resulting in desirable outputs. To the contrary, according to the conventional wisdom, applying voltage clamping would be understood as interrupting and thereby sacrificing nominal (desired) operation of the device to protect the device from damage and/or causing damage.

The voltage clamp may include one or more components to hold the first port 112 at the selected clamping voltage. In some cases, a combination of multiple clamping components may coordinate to achieve the clamping. For example, a Zener diode may be coupled to in parallel with the switching coupler 120 to dump current in excess of that which charges the first port 112 to the clamping voltage. A breakdown device such as a gas ionization tube may be similarly coupled. A metal-oxide varistor (MOV) may be similarly used. In some cases, a power converter may be paired with another capacitor and/or voltage clamp to effect the voltage clamping, while, at least in some implementations, recovering at least a portion of the energy used during voltage clamping.

Various parameters may be used to control various features of the shaped current. For example, the pulse peak value $I_{peak}$ may be based on the ratio of an input dc voltage ($V_{dc}$) and the inductance of the inductor (L) for a selected response time. For example, decreasing L linearly increases the current peak $I_{peak}$ (other factors constant). For example, increasing $V_{dc}$ may linearly increase the current peak $I_{peak}$ (other factors constant). For example, increasing the response time linearly increases the current peak $I_{peak}$ (other factors constant).

For example, the pulse response time may be based on the ratio of the inductance of the inductor (L) an input dc voltage ($V_{dc}$) for a selective current peak $I_{peak}$. For example, decreasing L linearly decreases the response time (other factors constant). For example, increasing $V_{dc}$ linearly decreases the response time (other factors constant). For example, increasing $I_{peak}$ linearly increase the response time (other factors constant).

For example, the pulse duration may be based on the product of an inductance of the inductor (L) to the capacitance of the capacitor (C). For example, increasing C increases the pulse duration (other factors constant). For example, increasing L increases the pulse duration (other factors constant). For example, decreasing clamping voltage decreases the pulse duration (other factors constant).

For example, the pulse response time and the pulse duration may be decoupled in some implementations. In such implementations, for example, decreasing L linearly decreases the response time (other factors constant). In such implementations, for example, increasing $V_{dc}$ linearly decreases the response time (other factors constant). In such implementations, for example, increasing $I_{peak}$ linearly increases the response time (other factors constant). In such implementations, for example, increasing C increases the pulse duration (other factors constant). In such implementations, for example, increasing L increases the pulse duration (other factors constant). In such implementations, for example, decreasing clamping voltage decreases the pulse duration (other factors constant).

After clamping, shaping logic 200 may discharge and/or otherwise reset the inductor 102 and/or capacitor 110 (210). For example, while the capacitor is clamped, the inductor 102 may be discharged. In some cases, the discharge of the inductor 102 or a portion thereof may be used to supply at least a portion of the energy used to maintain the clamping at the first port 112. In some cases, a power source, such as power source 104, may be used to supply at least a portion of the energy used to maintain the clamping at the first port 112. In some cases, the inductor 102 may be allowed to discharge independently of clamped operation of the capacitor 110. In some cases, the discharge of the inductor 102 may be achieved by discharging the inductor to (or below) a predefined reset current throughput. In some cases, the reset current throughput may be non-zero.

The capacitor 110 may be allowed to discharge when clamping at the first port 112 is released. In some cases, the rate at which the capacitor 110 is allowed to discharge may be kept low relative rates of charging during current shaping. Such constraints on capacitor 110 discharge rates may prevent the generation of current features on the scale of the shaped features.

The duty cycle of the example shaping device 100 may be adjusted in part by adjusting the discharge times of the capacitor 110 and inductor 102. In some cases, the discharge times (or the longer of the two discharge times, where discharge occurs in parallel), may be inversely proportional to a maximum supported duty cycle of the example shaping device 100. Thus, decreasing the discharge times may allow for a higher maximum supported duty cycle of the example shaping device 100 (other factors constant). Nevertheless, the duty cycle of the example shaping device 100 may be selected for other factors such as energy use, device longevity, application specific considerations, and/or other factors. Thus, discharge times may constrain the maximum supported duty cycle but are not necessarily determinative of the duty cycle in various implementations.

Example Implementations

Various illustrative example implementations are described below. Designations of particular features are included to clarify the relationship of that particular feature to the specific illustrative scenario/scenarios in which the particular feature is discussed. Such a relationship to the same degree may not apply without express description of such a relationship to other implementations. Nevertheless, the various features described with respect to the individual example implementations may be readily and optionally integrated with other implementations with or without various other features present in the respective example implementation.

Figure 3:
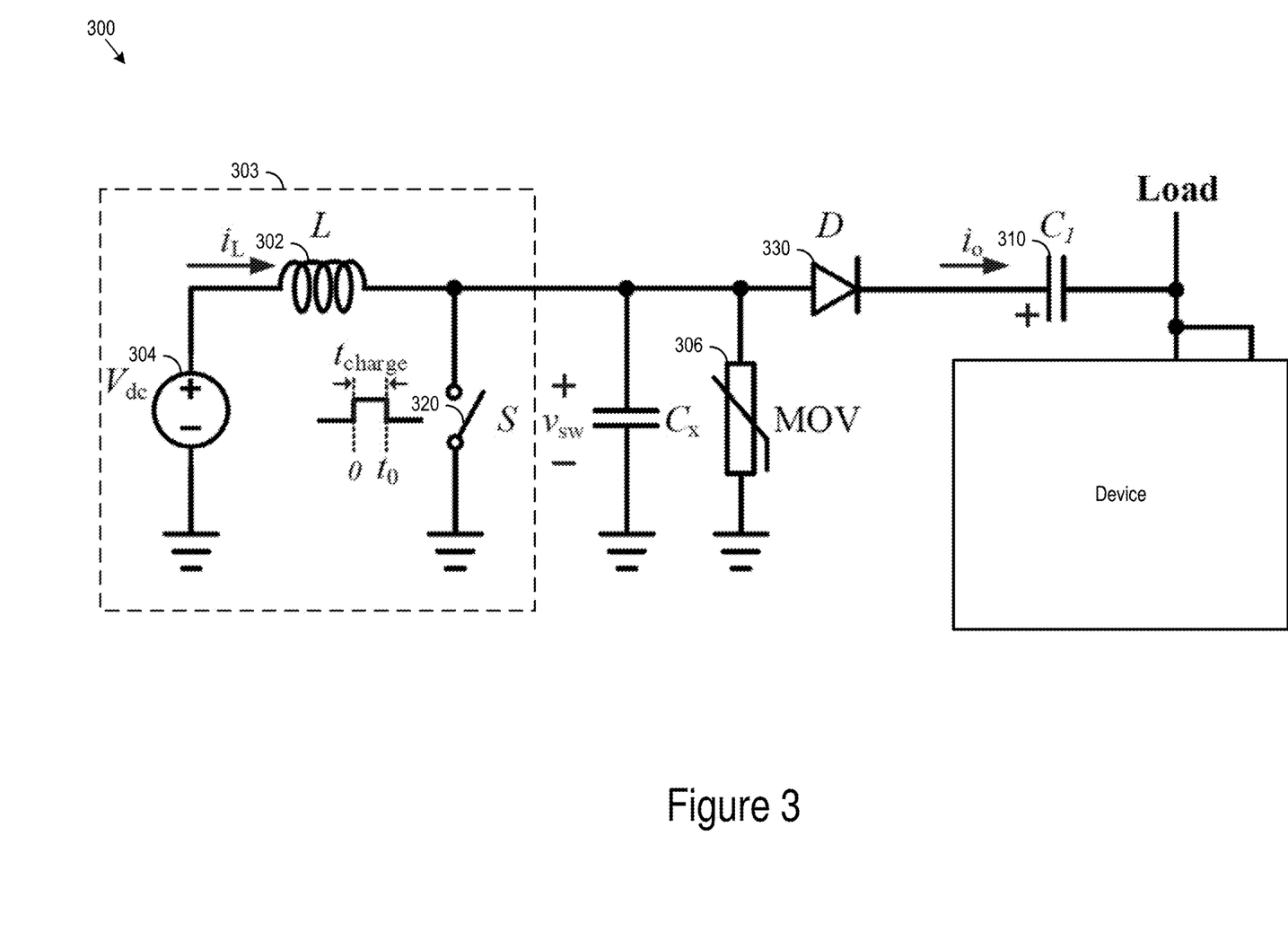
FIG. 3 shows an illustrative example three-mode current pulse generation device.

FIG. 3 shows an illustrative example three-mode current pulse generation device 300. In the illustrative example current pulse generation device 300, the voltage clamping may be provided by an MOV 306. A diode 330 is included between the inductor 302 and the capacitor 310. The inductor 302 is supplied by a power source 304. A switch 320 (with open and closed states) provides selective coupling between the inductor 302 and the capacitor 310. When closed, the switch 320 allows current to cycle in charge circuit 303, e.g. for charging the inductor 302. When open, the switch 320 prevents charging flow and directs current from the inductor to the capacitor 310.

Figure 4:
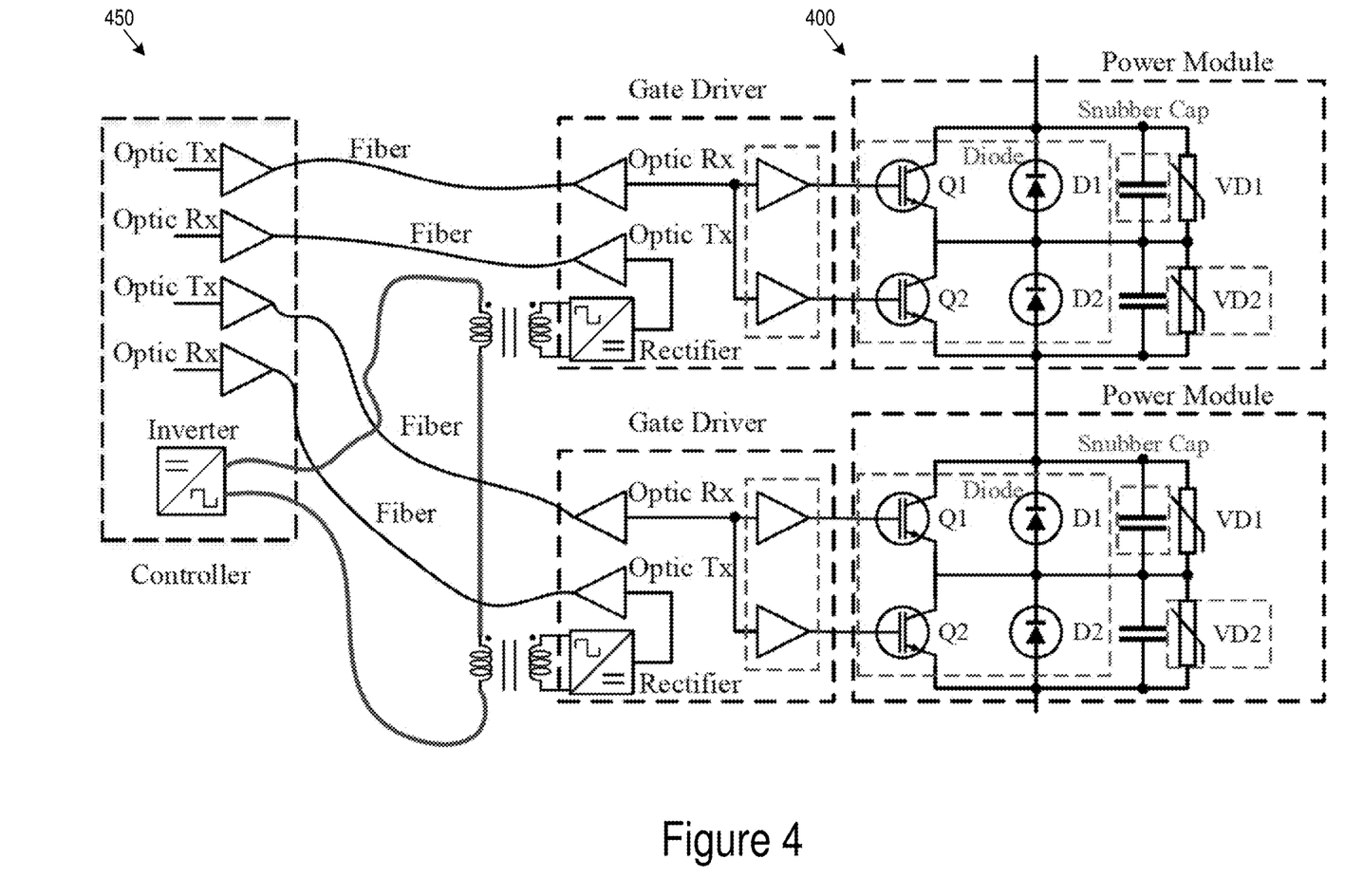
FIG. 4 shows an illustrative example selective coupler.

FIG. 4 shows an illustrative example selective coupler 400. The example selective coupler 400 is used to convert optical domain signals 450 into electrical domain signals and vice versa. Thus, the architectures and techniques discussed herein demonstrably may be used for domain conversion of optical Tx/Rx signals.

Various example implementations have been included for illustration. Other implementations are possible. Table 1 shows various examples.

TABLE 1

Examples

1. A method including:
charging an inductor to a selected current throughput;
at a time that the inductor is charged to the selected current throughput, coupling a current output of the inductor to a first port of capacitor to charge, for a period equal to a pulse duration, the first port to a clamping voltage;
at a time that the first port is charged to the clamping voltage, clamping TABLE 1-continued Examples the first port at the clamping voltage, where:
optionally, the method is in accord with any other example in this table.
2. A device including:
an inductor;
a capacitor including a first port and a second port;
a switch to selectively couple, at a time that the inductor is charged to the selected current throughput, an output of the inductor to a first port of the capacitor to charge, for a period equal to a pulse duration, the first port to a clamping voltage and thereby generate a rising edge for a pulse, such as a current pulse, at a second port of the capacitor; and
a voltage clamp coupled to the first port, the voltage clamp to clamp, at a time that the first port is charged to the clamping voltage, the first port at the clamping voltage and thereby generate a falling edge for the pulse, where:
optionally, the device is in accord with any other example in this table.
3. A device including:
an inductor;
a capacitor;
a switch to selectively couple an output of the inductor to a first port of the capacitor;
and
a voltage clamp coupled to the first port, the clamping voltage of the voltage clamp is less than a surge voltage for the inductor, capacitor, and/or switch, where:
optionally, nominal operation includes activation of the voltage clamp, e.g., the voltage clamp in included for reasons other than protection of components of the device from electrical damage, such as over voltage or over current conditions, where:
optionally, the device is in accord with any other example in this table.
4. The device or method of any of the other examples in this table, where the clamping voltage is less than a surge voltage for the inductor, capacitor, and/or switch, where:
optionally, the surge voltage is defined based on a peak current and/or characteristic impedance, $\sqrt{\frac{L}{C}}$ where L is an inductance of the inductor and C is the capacitance of the capacitor, such that for example, voltage levels exceeding the clamping voltage are expected during nominal operation of the device;
optionally, clamping voltage is less than 90% of the surge voltage;
optionally, clamping voltage is less than 80% of the surge voltage; and
optionally, clamping voltage is less than 50% of the surge voltage.
5. The device or method of any of the other examples in this table, where the charging of the capacitor from the inductor is linear or approximately linear (e.g., the current from the inductor is constant or approximately constant) such that the pulse has a flat and/or flattened top for a period relative to the rising and falling edges.
6. The device or method of any of the other examples in this table, where the switch includes a mechanical switch, a solid-state switch, and/or other non-mechanical switch.
7. The device or method of any of the other examples in this table, where the clamping is performed by a voltage clamp, where:
optionally, the voltage clamp includes a Zener diode;
optionally, the voltage clamp includes a breakdown device, such as a gas ionization tube;
optionally, the voltage clamp includes a varistor, such as a metal-oxide varistor (MOV);
optionally, the voltage clamp includes a power converter configured to recover discharged energy from the inductor and/or capacitor, where:
optionally, the power converter is paired with another capacitor to effect the voltage clamping;
optionally, the voltage clamp includes one or more diodes; and
optionally, the voltage clamp is connected in parallel to the switch.
8. The device or method of any of the other examples in this table, where a diode is included in series between the inductor and capacitor to prevent reverse flow from the capacitor to the inductor, where:
optionally, the voltage clamp is connected in parallel to the switch:
between the inductor and the diode; or
between the diode and the first port of the capacitor.
9. The device or method of any of the other examples in this table, further including discharging the inductor to a reset current after clamping the voltage at the first port.

TABLE 1-continued

Examples

10. The device or method of any of the other examples in this table, further including discharging the capacitor after clamping the voltage at the first port, where:
optionally, the discharge rate of the capacitor is less than the charging rate of the capacitor;
optionally, the discharge rate of the capacitor is selected to keep an amplitude of a reverse pulse low, such as:
less than 0.1% of the amplitude of the pulse generated during charging of the capacitor;
less than 1% of the amplitude of the pulse generated during charging of the capacitor;
less than 5% of the amplitude of the pulse generated during charging of the capacitor;
less than 10% of the amplitude of the pulse generated during charging of the capacitor; and
less than 50% of the amplitude of the generated during charging of the capacitor.
11A. The device or method of any of the other examples in this table, where the pulse peak value $I_{peak}$ is linearly selected based on the ratio of an input dc voltage ($V_{dc}$) and the inductance of the inductor (L) for a selective response time, where:
optionally, decreasing L linearly increases the current peak $I_{peak}$ (other factors constant);
optionally, increasing $V_{dc}$ linearly increases the current peak $I_{peak}$ (other factors constant);
optionally, increasing the response time linearly increases the current peak $I_{peak}$ (other factors constant).
11B. The device or method of any of the other examples in this table, where the pulse response time is linearly selected based on the ratio of the inductance of the inductor (L) an input dc voltage (Vdc) for a selective current peak $I_{peak}$, where:
optionally, decreasing L linearly decreases the response time (other factors constant);
optionally, increasing Vdc linearly decreases the response time (other factors constant);
optionally, increasing $I_{peak}$ linearly increase the response time (other factors constant).
11C. The device or method of any of the other examples in this table, where the pulse duration is selected based on the product of an inductance of the inductor (L) to the capacitance of the capacitor (C), where:
optionally, increasing C increases the pulse duration (other factors constant);
optionally, increasing L increases the pulse duration (other factors constant);
optionally, decreasing clamping voltage decreases the pulse duration (other factors constant).
11D. The device or method of any of the other examples in this table, where the pulse response time and the pulse duration are decoupled, where
optionally, decreasing L linearly decreases the response time (other factors constant);
optionally, increasing $V_{dc}$ linearly decreases the response time (other factors constant);
optionally, increase $I_{peak}$ linearly increase the response time (other factors constant),
optionally, increasing C increases the pulse duration (other factors constant);
optionally, increasing L increases the pulse duration (other factors constant);
optionally, decreasing clamping voltage decreases the pulse duration (other factors constant).
12. The device or method of any of the other examples in this table, where a duty cycle for pulse generation is selected by adjusting discharge times for the inductor, the capacitor, or both.
13. The device or method of any of the other examples in this table, where the pulse duration includes:
optionally, adoration less than 1 picosecond;
optionally, adoration greater than 1 picosecond;
optionally, adoration less than 1 nanosecond;
optionally, adoration greater than 1 nanosecond;
optionally, adoration less than 100 nanoseconds;
optionally, adoration greater than 100 nanoseconds;
optionally, a doration less than 500 nanoseconds;
optionally, a doration greater than 500 nanoseconds;
optionally, adoration less than 1 microsecond;
optionally, adoration greater than 1 microsecond;
optionally, adoration less than 1 millisecond;
optionally, adoration greater than 1 millisecond;
optionally, adoration less than 10 milliseconds;
optionally, adoration greater than 10 milliseconds;
optionally, adoration less than 100 milliseconds; and
optionally, adoration greater than 100 milliseconds.
14. The device or method of any of the other examples in this table, where the selected current throughput includes:
optionally, a current less than 1 microamp;
optionally, a current greater than 1 microamp;
optionally, a current less than 1 milliamp;
optionally, a current greater than 1 milliamp;
optionally, a current less than 1 amp;
optionally, a current greater than 1 amp;
optionally, a current less than 10 amps;
optionally, a current greater than 10 amps;
optionally, a current less than 100 amps;
optionally, a current greater than 100 amps;
optionally, a current less than 200 amps;
optionally, a current greater than 200 amps;
optionally, a current less than 500 amps;
optionally, a current greater than 500 amps;
optionally, a current less than 10 kiloamps;
optionally, a current greater than 10 kiloamps;
optionally, a current less than 100 kiloamps; and
optionally, a current greater than 100 kiloamps.
15. The device or method of any of the other examples in this table, where the clamping voltage includes:
optionally, a voltage less than 1 microvolt;
optionally, a voltage greater than 1 microvolt;
optionally, a voltage less than 1 millivolt;
optionally, a voltage greater than 1 millivolt;
optionally, a voltage less than 1 volt;
optionally, a voltage greater than 1 volt;
optionally, a voltage less than 10 volts;
optionally, a voltage greater than 10 volts;
optionally, a voltage less than 100 volts;
optionally, a voltage greater than 100 volts;
optionally, a voltage less than 200 volts;
optionally, a voltage greater than 200 volts;
optionally, a voltage less than 500 volts;
optionally, a voltage greater than 500 volts;
optionally, a voltage less than 1 kilovolt;
optionally, a voltage greater than 1 kilovolt;
optionally, a voltage less than 5 kilovolts;
optionally, a voltage greater than 5 kilovolts;
optionally, a voltage less than 10 kilovolts;
optionally, a voltage greater than 10 kilovolts;
optionally, a voltage less than 50 kilovolts;
optionally, a voltage greater than 50 kilovolts;
optionally, a voltage less than 100 kilovolts;
optionally, a voltage greater than 100 kilovolts;
optionally, a voltage less than 200 kilovolts;
optionally, a voltage greater than 200 kilovolts;
optionally, a voltage less than 1 megavolt; and
optionally, a voltage greater than 1 megavolt.
16. A method including generating a pulse by charging a capacitor, e.g., from a precharged inductor L and/or a dc input voltage Vdc or other source, to a clamping voltage and clamping the voltage at the clamping voltage, where:
optionally the method is in accord with any of the other examples in this table.
17. A device implementing the method of example 16 or any of the other example in this table.
18. The method or device of any of the other examples in this table, where the pulse has negative or positive polarity, for example, such that rising and falling edges are defined in terms of pulse magnitude rather than polarity.
19. A device including:
an inductor;
a capacitor including:
a first port; and
a second port;
a switch to shape a first characteristic within current produced at the second port by selectively coupling an output of the inductor to the first port to charge the first port;
and
a voltage clamp coupled to the first port, the voltage clamp configured to activate at a time the first port is charged to a TABLE 1-continued Examples clamping voltage by the inductor to shape a second characteristic within the current produced at the second port, where:
optionally, the device is in accord with any other example in this table.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A method including:
charging an inductor to a selected current throughput;
at a time that the inductor is charged to the selected current throughput, coupling a current output of the inductor to a first port of a capacitor to charge the first port for a period equal to a pulse duration; and
at a time that the first port of the capacitor is charged to a clamping voltage, clamping the first port at the clamping voltage.

2. The method of claim 1, where the clamping voltage is less than a surge voltage for the inductor and/or the capacitor, the surge voltage including a voltage at which surge protection circuitry interrupts a nominal operation to protect the inductor and/or the capacitor from damage.

3. The method of claim 2, where the clamping voltage is less than 90% of the surge voltage for the inductor and/or the capacitor.

4. The method of claim 1, where coupling the current output of the inductor to the first port of the capacitor includes operating a switch to couple the current output of the inductor to the first port of the capacitor.

5. The method of claim 1, where current from the inductor during charging of the first port of the capacitor is constant such that a generated pulse has a flattened top, relative to rising and falling edges, for the period.

6. The method of claim 1, further including preventing a reverse current flow from the capacitor to the inductor using a diode included in series between the inductor and the capacitor.

7. The method of claim 1, further including discharging the inductor to a reset current after clamping the first port at the clamping voltage.

8. The method of claim 1, where the pulse duration is selected based on a product of an inductance of the inductor to a capacitance of the capacitor.

9. The method of claim 1, where the clamping is performed by a voltage clamp, including:
a Zener diode;
a gas ionization tube;
a metal-oxide varistor (MOV); and/or
a power converter configured to recover discharged energy from the inductor and/or the capacitor.

10. A device including:
an inductor;
a capacitor including a first port and a second port;
a switch configured to selectively couple, at a time that the inductor is charged to a selected current throughput, an output of the inductor to the first port of the capacitor to charge, for a period equal to a pulse duration, the first port to a clamping voltage and thereby generate a rising edge for a current pulse at the second port of the capacitor; and
a voltage clamp coupled to the first port, the voltage clamp configured to clamp, at a time that the first port is charged to the clamping voltage, the first port at the clamping voltage and thereby generate a falling edge for the current pulse.

11. The device of claim 10, where the clamping voltage is less than a surge voltage for the inductor, the capacitor, and/or the switch, the surge voltage including a voltage at which surge protection circuitry interrupts nominal operation of the device to protect the inductor, the capacitor, and/or the switch from damage.

12. The device of claim 11, where the surge voltage is selected based on a peak allowed current and characteristic impedance, $$\sqrt{\frac{L}{C}}$$

where L is an inductance of the inductor and C is the capacitance of the capacitor.

13. The device of claim 10, where the switch includes a mechanical switch and/or a solid-state switch.

14. The device of claim 10, further including a diode coupled in series between the inductor and the capacitor to prevent a reverse current flow from the capacitor to the inductor.

15. The device of claim 14, where the voltage clamp is coupled in parallel to the switch between the inductor and the diode.

16. The device of claim 14, where the voltage clamp is coupled in parallel to the switch between the diode and the first port of the capacitor.

17. The device of claim 10, where the inductor is configured to provide a constant current during charging of the first port of the capacitor such that the current pulse has a flattened top, relative to rising and falling edges.

18. The method of claim 1, where the voltage clamp, includes:
a Zener diode;
a gas ionization tube;
a metal-oxide varistor (MOV); and/or
a power converter configured to recover discharged energy from the inductor and/or the capacitor.

19. A device including:
an inductor;
a capacitor including:
a first port; and
a second port;
a switch to shape a first characteristic within current produced at the second port by selectively coupling an output of the inductor to the first port to charge the first port; and
a voltage clamp coupled to the first port, the voltage clamp configured to activate at a time the first port is charged to a clamping voltage by the inductor to shape a second characteristic within the current produced at the second port.

20. The device of claim 19, where a pulse response time and a pulse duration are decoupled, the pulse response time and the pulse duration being associated with the first and second characteristics within the current produced at the second port.

* * * * *